United States Patent
Hatano et al.

(10) Patent No.: US 12,249,521 B2
(45) Date of Patent: Mar. 11, 2025

(54) TEMPERATURE CONTROL UNIT

(71) Applicant: Tomoegawa Corporation, Tokyo (JP)

(72) Inventors: Shuhei Hatano, Shizuoka (JP); Hideki Moriuchi, Shizuoka (JP)

(73) Assignee: Tomoegawa Corporation, Tokyo (JP)

( * ) Notice: Subject to any disclaimer, the term of this patent is extended or adjusted under 35 U.S.C. 154(b) by 130 days.

(21) Appl. No.: 18/007,387

(22) PCT Filed: Sep. 13, 2021

(86) PCT No.: PCT/JP2021/033520
§ 371 (c)(1),
(2) Date: Jan. 30, 2023

(87) PCT Pub. No.: WO2022/123846
PCT Pub. Date: Jun. 16, 2022

(65) Prior Publication Data
US 2023/0282495 A1 Sep. 7, 2023

(30) Foreign Application Priority Data
Dec. 11, 2020 (JP) .................................. 2020-205832

(51) Int. Cl.
*F28F 7/00* (2006.01)
*H01L 21/67* (2006.01)

(52) U.S. Cl.
CPC .............................. *H01L 21/67103* (2013.01)

(58) Field of Classification Search
CPC ................................................. H01L 21/67103
USPC .......................................................... 165/185
See application file for complete search history.

(56) References Cited

U.S. PATENT DOCUMENTS

2005/0111188 A1* 5/2005 Bhattacharya ........ H01L 23/427
361/708
2018/0096867 A1 4/2018 Lu

FOREIGN PATENT DOCUMENTS

| JP | 2000-101004 A | 4/2000 |
| JP | 2001-267403 A | 9/2001 |
| JP | 2003-249781 A | 9/2003 |
| JP | 2013-145835 A | 7/2013 |
| WO | 2020235449 A1 | 11/2020 |
| WO | 2020246259 A1 | 12/2020 |

OTHER PUBLICATIONS

International Search Report (English Translation) for corresponding PCT/JP2021/033520 dated Nov. 24, 2021 (2 pp).
Supplementary European Search Report for corresponding PCT/JP2021/033520 dated Jun. 6, 2024 (8 pp).

* cited by examiner

*Primary Examiner* — Davis D Hwu
(74) *Attorney, Agent, or Firm* — Renner, Kenner, Greive, Bobak, Taylor & Weber

(57) ABSTRACT

A temperature control unit includes: a substantially flat-plate-shaped placement section (10) configured to support a heat transfer target; a heating section (20) configured to heat a heat transfer target placed on the placement section (10); and a heat transfer section (30) disposed in contact with at least one of the placement section (10) and the heating section (20), the heat transfer section (30) being at least partially formed of a metal porous structure.

20 Claims, 8 Drawing Sheets

TEMPERATURE CONTROL UNIT

TECHNICAL FIELD

The present invention relates to a temperature control unit.

BACKGROUND ART

To date, various types of temperature control units for heating heat transfer targets have been known. For example, in production of a semiconductor device or flat display panel, a temperature control unit for performing heat treatment of a semiconductor substrate or a flat display panel substrate is used in a testing step. As such a temperature control unit, the temperature control units disclosed in Japanese Laid-Open Patent Publication No. 2007-250313 (JP2007-250313A), Japanese Laid-Open Patent Publication No. 2007-149727 (JP2007-149727A), and the like, are known.

In production of semiconductor devices and flat display panels, mass production through continuous operation leads to price reduction for products. Therefore, takt time has been required to be shortened in the testing step. Japanese Laid-Open Patent Publication No. 2007-250313 and Japanese Laid-Open Patent Publication No. 2007-149727 disclose a technique capable of increasing a temperature rising rate when a heat transfer target is heated, in order to shorten the takt time in a testing step.

SUMMARY OF THE INVENTION

Conventional temperature control units have a problem that uniformity of an in-plane temperature of a placement surface of a placement section on which a heat transfer target is placed cannot be enhanced, when a temperature rising rate is changed during heating of the heat transfer target.

The present invention has been made in view of such circumstances, and an object of the present invention is to provide a temperature control unit capable of enhancing uniformity of an in-plane temperature of a placement surface of a placement section on which a heat transfer target is placed.

A temperature control unit of the present invention includes: a substantially flat-plate-shaped placement section configured to support a heat transfer target; a heating section configured to heat a heat transfer target placed on the placement section; and a heat transfer section disposed in contact with at least one of the placement section and the heating section, the heat transfer section being at least partially formed of a metal porous structure.

Another temperature control unit of the present invention includes: a substantially flat-plate-shaped placement section configured to support a heat transfer target; a heating section configured to heat a heat transfer target placed on the placement section; a heat transfer section disposed in contact with at least one of the placement section and the heating section; and a housing configured to house the heat transfer section between the placement section and the housing. The housing is formed to have a space configured to allow fluid to flow therein. The space formed in the housing is demarcated into a plurality of regions by a partition member. Each of the regions is configured to allow fluid to flow therein.

The temperature control units of the present invention are capable of enhancing uniformity of an in-plane temperature of the placement surface of the placement section on which a heat transfer target is placed.

DESCRIPTION OF THE PREFERRED EMBODIMENTS

Embodiments of the present invention will be described below with reference to the drawings. FIG. 1 to FIG. 11 illustrate various temperature control units according to the present embodiments. The temperature control units according to the present embodiments are, for example, for heating heat transfer targets such as semiconductor substrates and flat display panel substrates.

[First Temperature Control Unit]

Figure 1:
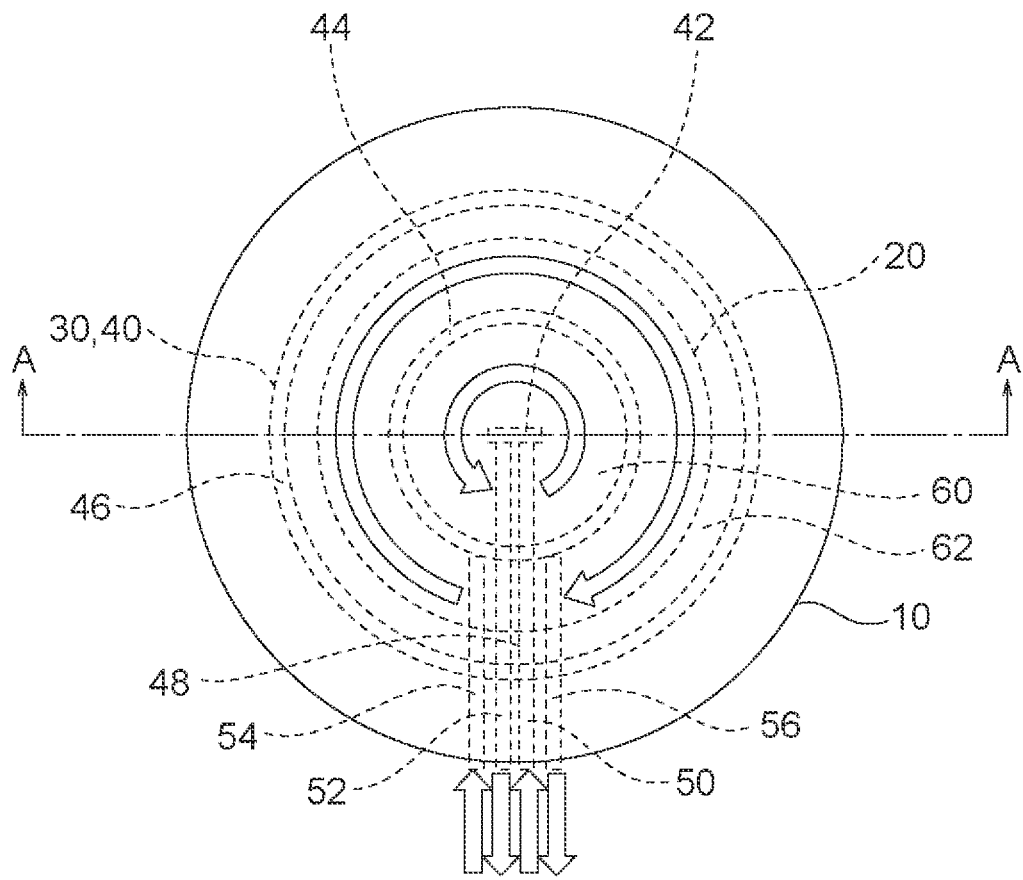
FIG. 1 is a top view of a configuration of a first temperature control unit according to an embodiment of the present invention.
Figure 2:
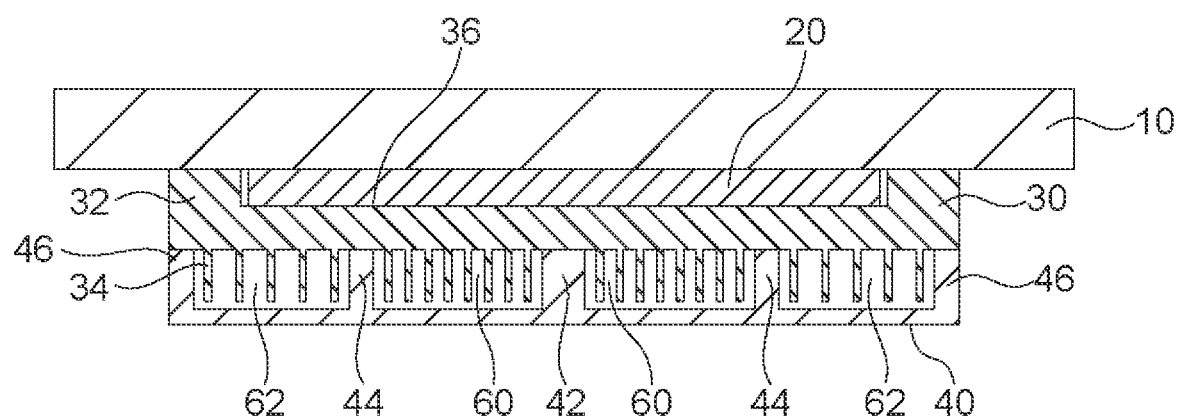
FIG. 2 is a lengthwise cross-sectional view of the first temperature control unit in FIG. 1 as seen in the direction of arrows A-A.
Figure 3:
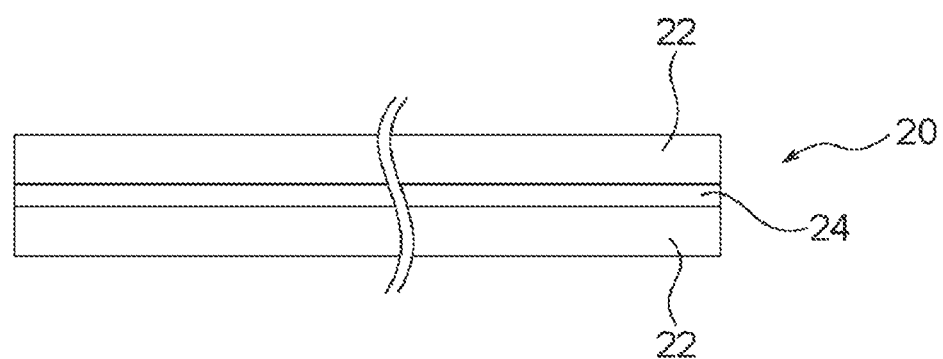
FIG. 3 is a configuration diagram illustrating a configuration of a heating section of the first temperature control unit in FIG. 2.

FIG. 1 to FIG. 3 illustrate a first temperature control unit according to the present embodiment. Among them, FIG. 1 is a top view of a configuration of the first temperature control unit, FIG. 2 is a lengthwise cross-sectional view of the first temperature control unit in FIG. 1 as seen in the direction of arrows A-A, and FIG. 3 is a configuration diagram illustrating a configuration of a heating section of the first temperature control unit in FIG. 2. As illustrated in FIG. 1 to FIG. 3, the first temperature control unit according to the present embodiment includes a substantially flat-plate-shaped placement section 10 on which a heat transfer target is to be placed, a heating section 20 for heating the heat transfer target placed on the placement section 10, a heat transfer section 30 that is disposed in contact with the placement section 10 and the heating section 20 and is at least partially formed of a metal porous structure, and a housing 40 that houses the heat transfer section 30 between the placement section 10 and the housing 40 and has therein a flow path in which fluid flows.

Next, components of the first temperature control unit having such a structure will be described below in detail.

For example, the placement section 10 is formed of a heat-conductive material that is substantially flat-plate-shaped and has a substantially round shape as viewed from thereabove. Specifically, the placement section 10 is formed of, for example, a metal such as aluminium.

On the placement section 10, a heat transfer target that is a substrate such as a semiconductor substrate or a flat display panel substrate to be heated is placed.

As illustrated in FIG. 3, the heating section 20 includes a pair of protective members 22, and a heat generating member 24 disposed between the protective members 22. Each of the protective members 22 is, for example, formed of an insulator in the form of a thin layer, such as a polyimide film, a ceramic film, or a resin film. Each of the protective members 22 is heat-conductive. The heat generating member 24 is formed of metal foil, a metal wire, metal paper, a metal sheet, or the like. As the metal of the heat generating member 24, stainless steel, nichrome, kanthal, or the like is preferably used. In a case where such a material is used, an amount of generated heat can be increased. As the heat generating member 24, metal paper is preferably used. In this case, risk of wire breakage is reduced, and responsiveness to a rising/falling temperature becomes quick, so that these can contribute to shortening the takt time. The heat generating member 24 may not necessarily be formed of a metal, and may be formed of a material other than a metal as long as the material can generate heat.

The heat transfer section 30 has a substantially flat-plate-shaped base member 32 disposed in contact with the heating section, and a plurality of protruding members 34 that protrude downward from the lower surface of the base member 32. As illustrated in FIG. 2, the base member 32 has a recess 36 formed therein, and the heating section 20 is housed in the recess 36. A region on the upper surface of the base member 32 other than the recess 36 is in contact with the lower surface of the placement section 10. Specifically, for example, the base member 32 of the heat transfer section 30 is mounted to the lower surface of the placement section 10 through a joining layer such as highly heat-conductive grease. The base member 32 of the heat transfer section 30 may be mechanically mounted directly to the lower surface of the placement section 10 without using a joining layer. As illustrated in FIG. 2, the upper surface and the lower surface of the heating section 20 housed in the recess 36 are in contact with the placement section 10 and the base member 32, respectively. The plurality of protruding members 34 are each bar-shaped, and extend downward from the lower surface of the base member 32. More specifically, the protruding members 34 each extend in the direction orthogonal to the lower surface of the base member 32, and the protruding members 34 extend in directions parallel to each other. For example, each of the protruding members 34 is disposed on a corresponding intersection point of a grid line.

At least a part of the heat transfer section 30 is formed of a metal porous structure. The metal porous structure preferably contains a metal fiber structure formed of metal fibers. The metal fibers preferably include at least one of copper fibers, aluminium fibers, nickel fibers, and stainless steel fibers. More specifically, although specific examples of the metal of the metal fiber are not particularly limited, the metal of the metal fiber may be selected from the group consisting of stainless steel, iron, copper, aluminium, bronze, brass, nickel, chromium, and the like, or may be a noble metal selected from the group consisting of gold, platinum, silver, palladium, rhodium, iridium, ruthenium, osmium, and the like. Among them, copper fibers and aluminium fibers have excellent heat-conductivity and have stiffness and plastic deformability in a properly balanced manner, and are thus preferable. Furthermore, as the heat transfer section 30, porous ceramics may be used.

In a case where the heat transfer section 30 is formed of the metal fiber structure, the metal fiber structure is preferably non-woven fabric in which fibers are bound to each other. The non-woven fabric may be merely formed of metal fibers, or may contain, in addition to metal fibers, a material (for example, heat-conductive particles such as alumina particles) other than metal fibers. A state where metal fibers are bound to each other refers to a state where metal fibers are physically fixed, and a portion at which metal fibers are physically fixed is referred to as a binding portion. At the binding portion, the metal fibers may be fixed directly to each other, or parts of the metal fibers may be fixed indirectly to each other through a component other than a metal component. Examples of the component other than a metal component include polyolefin resins such as polyethylene resins and polypropylene resins, polyethylene terephthalate (PET) resins, polyvinyl alcohol (PVA) resins, polyvinyl chloride resins, aramid resins, nylon, acrylic resins, and the like and fibrous materials formed of these resins. Furthermore, for example, an organic material capable of binding to and carrying metal fibers may be used for the binding portion.

Although an average fiber diameter of the metal fiber can be optionally set as long as uniformity of the non-woven fabric is not impaired, the size preferably ranges from 1 μm to 30 μm and more preferably ranges from 2 μm to 20 μm. In a case where the average fiber diameter of the metal fiber is greater than or equal to 1 μm, the metal fiber can have appropriate stiffness, and so-called lumps tend to be unlikely to occur when the non-woven fabric is formed. In a case where the average fiber diameter of the metal fiber is less than or equal to 30 μm, the metal fiber can have appropriate flexibility, and the fibers tend to appropriately intersect each other. The metal fiber preferably has a smaller average fiber diameter as long as the metal fibers are not hindered from being formed into the non-woven fabric, since uniformity of the non-woven fabric is easily enhanced. In the description herein, the "average fiber diameter" refers to an average value (for example, an average value of 20 fibers) of area diameters each obtained in a manner in which a cross-sectional area of a metal fiber on any cross-section perpendicular to the longitudinal direction of non-woven fabric of the metal fibers captured through a microscope is calculated (for example, by using known software), and a diameter of a circle having the same area as the cross-sectional area is calculated.

Although the cross-sectional shape perpendicular to the longitudinal direction of the metal fiber may be any of a round shape, an ellipsoidal shape, a substantially quadrangular shape, an irregular shape, and the like, the cross-sectional shape is preferably round. In the description herein, the round cross-section may have such a round cross-sectional shape as to be easily bent when subjected to stress during production of the non-woven fabric of the metal fibers, and the round-cross-section may not necessarily have a perfectly round shape.

The average fiber length of the metal fibers preferably ranges from 1 mm to 10 mm and more preferably ranges from 3 mm to 5 mm. The metal fiber preferably has a shorter fiber length as long as the metal fibers are not hindered from being formed in the non-woven fabric, since uniformity of the non-woven fabric of the metal fibers is easily enhanced. In a case where the average fiber length ranges from 1 mm to 10 mm, when, for example, the non-woven fabric of the metal fibers is produced by a sheet making method, so-called lumps of the metal fibers are unlikely to occur, the dispersibility of the metal fibers is easily controlled, and the metal fibers are appropriately interlaced, so that an effect of enhancing handling strength of the non-woven fabric of the metal fibers is also likely to be exhibited. In the description herein, the "average fiber length" is a value obtained by measuring 20 fibers by a microscope and calculating an average of the measured values.

As the heat transfer section 30, woven fabric of metal fibers may be used instead of non-woven fabric of metal fibers. Some of woven fabrics of metal fibers are extensible/contractible. Therefore, in a case where the heat transfer section 30 formed of such extensible/contractible woven fabric of metal fibers is used, when the placement section 10 or the heating section 20 mounted to the heat transfer section 30 is extended/contracted, the heat transfer section 30 is also extended/contracted according thereto. Thus, a gap can be prevented from being partially generated between the heat transfer section 30 and the placement section 10 or the heating section 20.

In the present embodiment, at least one of the base member 32 and the protruding members 34 of the heat transfer section 30 may be formed of the metal porous structure and more preferably formed of the above-described metal fiber structure. More advantageously, both the base member 32 and the protruding members 34 are formed of the metal porous structures and more preferably formed of the above-described metal fiber structures.

The kind of the metal of the metal fibers contained in the base member 32 and the kind of the metal of the metal fibers contained in the protruding members 34 are preferably the same. In this case, since the base member 32 and the protruding members 34 are formed of the same kind of metals, corrosion can be inhibited from occurring at an interface between the base member 32 and the protruding members 34. That is, in a case where the kind of the metal of the metal fibers contained in the base member 32 and the kind of the metal of the metal fibers contained in the protruding members 34 are different from each other, current flows due to a potential difference between the two metals, and a hole may be formed in the metals.

A method for producing the heat transfer section 30 having such a structure will be described. Firstly, the metal fibers and the like are dispersed in water to obtain sheet-making slurry. Subsequently, the obtained sheetmaking slurry is charged in a batch-type sheetmaking device. In a tank of the batch-type sheetmaking device into which the sheetmaking slurry has been charged, bar-shaped members to be formed into the protruding members 34 are set such that the lower portions of the bar-shaped members are in contact with a sheetmaking net and the upper portions thereof are fixed. Thereafter, water filtration is performed, whereby the heat transfer section 30 can be obtained, in which the bar-shaped members to be formed into the protruding members 34 stand in the normal directions on the base member 32 including at least the metal fibers. After the water filtration, the bar-shaped members to be formed into the protruding members 34 may be caused to stand on the base member 32. In a state where the bar-shaped members to be formed into the protruding members 34 are maintained so as to stand on the base member 32 in the normal direction, sintering may be performed in an atmosphere containing, for example, 75% of hydrogen gas and 25% of nitrogen gas, whereby the heat transfer section 30 can be obtained, in which the bar-shaped members to be formed into the protruding members 34 are partially fused to the metal fibers of the base member 32.

The housing 40 houses the heat transfer section 30, more specifically, the protruding members 34 between the placement section 10 and the housing 40. As the housing 40 having such a structure, for example, a lid formed of aluminium is used. The housing 40 is formed to have therein spaces 60, 62 configured to allow fluid to flow, such as water, air, or Fluorinert serving as a cooling medium or a heating medium. Fluid as a cooling medium or a heating medium flows in the spaces 60, 62 formed in the housing 40 having such a structure, whereby heat of the fluid is transferred to a heat transfer target placed on the placement section 10 through the heat transfer section 30, the heating section 20, and the placement section 10. The protruding members 34 are in the spaces 60, 62 formed in the housing 40, whereby efficiency for transferring heat by the heat transfer section 30 can be enhanced.

More specifically, as illustrated in FIG. 1 and FIG. 2, the housing 40 has a first partition member 42, a second partition member 44, a third partition member 46, and a wall member 48. The first space 60 is formed between the first partition member 42 and the second partition member 44, and the second space 62 is formed between the second partition member 44 and the third partition member 46. The first space 60 and the second space 62 are demarcated by the second partition member 44 so as not to connect to each other. As illustrated in FIG. 1, each of the first space 60 and the second space 62 forms an annular flow path, and the start point and the end point of each flow path are defined by the wall member 48. That is, the space formed in the housing 40 is demarcated, by the partition members 42, 44, 46 and the wall member 48, into a plurality of regions (specifically, two spaces 60, 62) that form substantially concentric circles. Fluid as a cooling medium or a heating medium is sent into the first space 60 through a first introduction pipe 50, and the fluid flows counterclockwise in the annular first space 60 as viewed from thereabove, and is discharged through a first discharge pipe 52. Meanwhile, fluid as a cooling medium or a heating medium is sent into the second space 62 through a second introduction pipe 54, and the fluid flows clockwise in the annular second space 62 as viewed from thereabove, and is discharged through a second discharge pipe 56. Thus, fluid flows in each of the regions such that fluids in the adjacent regions (two spaces 60, 62) flow in opposite directions. Thus, heat of the fluids flowing in the spaces 60, 62 is uniformly transferred to a heat transfer target placed on the placement section 10, through the heat transfer section 30, the heating section 20, and the placement section 10.

As illustrated in FIG. 1, the number of the protruding members 34 protruding from the base member 32 may be determined such that the density of the protruding members 34 disposed in the first space 60 near the center of the temperature control unit is greater than the density of the protruding members 34 disposed in the second space 62 near the peripheral portion of the temperature control unit. As illustrated in FIG. 1, in a case where the first space 60 has a smaller volume than the second space 62 and a residence time of the fluid is shorter in the first space 60, an amount of heat transferred from the fluid flowing in the second space 62 to the heat transfer target may be greater than an amount of heat transferred from the fluid flowing in the first space 60 to the heat transfer target. However, in the case where the density of the protruding members 34 in the first space 60 is greater than the density of the protruding members 34 in the second space 62, heat of the fluids flowing in the spaces 60, 62 can be uniformly transferred to a heat transfer target placed on the placement section 10, through the heat transfer section 30, the heating section 20, and the placement section 10.

Next, an operation of the temperature control unit having such a structure will be described.

When a heat transfer target is heated by the temperature control unit, the heat transfer target is firstly placed on the placement section 10. Subsequently, the heat transfer target placed on the placement section 10 is heated by the heating section 20. At this time, since the placement section 10 is formed of, for example, a heat-conductive metal such as aluminium, heat by the heating section 20 is transferred to the heat transfer target through the placement section 10.

In a case where a temperature rising rate is increased when the heat transfer target is heated by the heating section 20, a heating medium is caused to flow in the spaces 60, 62 formed in the housing 40. Specifically, when the heating medium is sent into the first space 60 through the first introduction pipe 50, the heating medium flows counter-clockwise in the annular first space 60 as viewed from thereabove, and is discharged through the first discharge pipe 52. Meanwhile, when the heating medium is sent into the second space 62 through the second introduction pipe 54, the heating medium flows clockwise in the annular second space 62 as viewed from thereabove, and is discharged through the second discharge pipe 56. Thus, when the heating medium flows in the spaces 60, 62 formed in the housing 40, heat of the heating medium is transferred to the heat transfer target through the heat transfer section 30, the heating section 20, and the placement section 10, so that the temperature rising rate of the heat transfer target is successfully increased. At this time, since at least a part of the heat transfer section 30 is formed of the metal porous structure, a sufficient heat transfer effect can be obtained, and responsiveness is thus enhanced, thereby shortening takt time. In the case where the heat transfer section 30 to be used is at least partially formed of the metal porous structure, when the placement section 10 or the heating section 20 is extended/contracted, the heat transfer section 30 is also extended/contracted according thereto, as compared with a case where a heat transfer section to be used is formed of a solid material instead of a porous material. In this case, a gap can be prevented from being partially generated between the heat transfer section 30 and the placement section 10 or the heating section 20, so that uniformity of an in-plane temperature of the placement surface of the placement section 10 on which a heat transfer target is placed can be enhanced.

In a case where a temperature rising rate is reduced when a heat transfer target is heated by the heating section 20, a cooling medium is caused to flow in the spaces 60, 62 formed in the housing 40. Specifically, when the cooling medium is sent into the first space 60 through the first introduction pipe 50, the cooling medium flows counter-clockwise in the annular first space 60 as viewed from thereabove, and is discharged through the first discharge pipe 52. Meanwhile, when the cooling medium is sent into the second space 62 through the second introduction pipe 54, the cooling medium flows clockwise in the annular second space 62 as viewed from thereabove, and is discharged through the second discharge pipe 56. Thus, when the cooling medium flows in the spaces 60, 62 formed in the housing 40, heat of the cooling medium is transferred to the heat transfer target through the heat transfer section 30, the heating section 20, and the placement section 10, so that the temperature rising rate of the heat transfer target can be reduced. At this time, since at least a part of the heat transfer section 30 is formed of the metal porous structure, a sufficient heat transfer effect can be obtained, and responsiveness is thus enhanced, thereby shortening takt time.

As described above, in the first temperature control unit of the present embodiment, at least a part of the heat transfer section 30 disposed in contact with at least one of the placement section 10 and the heating section 20 is formed of the metal porous structure. Therefore, in a case where the temperature rising rate is changed when a heat transfer target is heated by the heating section 20, since at least a part of the heat transfer section 30 is formed of the metal porous structure, a sufficient heat transfer effect can be obtained, and responsiveness is thus enhanced, thereby shortening takt time. Furthermore, In the case of using the heat transfer section 30 that is at least partially formed of the metal porous structure, when the placement section 10 or the heating section 20 is extended/contracted, the heat transfer section 30 is also extended/contracted according thereto, whereby a gap can be prevented from being partially generated between the heat transfer section 30 and the placement section 10 or the heating section 20, so that uniformity of an in-plane temperature of the placement surface of the placement section 10 on which a heat transfer target is placed can be enhanced, as compared with a case of using a heat transfer section formed of a solid material instead of a porous material.

Moreover, in the first temperature control unit of the present embodiment, the metal porous structure may include a metal fiber structure formed of metal fibers. In this case, by using the metal fiber structure formed of metal fibers, when the placement section 10 or the heating section 20 is extended/contracted, the heat transfer section 30 is more assuredly extended/contracted according thereto, so that a gap can be more assuredly prevented from being partially generated between the heat transfer section 30 and the placement section 10 or the heating section 20, and, therefore, uniformity of an in-plane temperature of the placement surface of the placement section 10 on which a heat transfer target is placed can be more effectively enhanced. The metal fibers may include at least one of copper fibers, aluminium fibers, nickel fibers, and stainless steel fibers. Among them, copper fibers and aluminium fibers have excellent heat-conductivity and also have stiffness and plastic-deformability in a properly balanced manner, and are thus preferable. The metal fiber structure may be non-woven fabric.

The heat transfer section 30 has the substantially flat-plate-shaped base member 32 disposed in contact with the heating section 20, and the protruding members 34 that protrude from the base member 32. At least the base member 32 or the protruding members 34 is formed of the metal porous structure. More preferably, both the base member 32 and the protruding members 34 are formed of the metal porous structure. In another embodiment, only one of the base member 32 and the protruding members 34 may be formed of the metal porous structure. In the heat transfer section 30, a plurality of the protruding members 34 are disposed, and each of the protruding members 34 is a bar-shaped member extending in the direction orthogonal to the base member 32. Each of the protruding members 34 is not limited to such a structure. As the plurality of the protruding members 34, plate-shaped members may be used or bar-shaped members and plate-shaped members may be used in combination.

The temperature control unit further includes the housing 40 for housing the heat transfer section 30 between the placement section 10 and the housing 40. In the housing 40, the spaces 60, 62 in which fluid flows are formed. In this case, fluid such as a cooling medium or a heating medium is caused to flow in the spaces 60, 62, whereby a temperature rising rate can be changed when a heat transfer target is heated. The spaces 60, 62 formed between the placement section 10 and the housing 40 are demarcated as a plurality of regions by the partition members (specifically, the first partition member 42, the second partition member 44, and the third partition member 46), and fluid is caused to flow in each region. In this case, since the spaces 60, 62 in each of which fluid flows are demarcated as a plurality of regions, the state of the fluid (for example, kind, flow rate, temperature, or the like of the fluid) flowing in each region can be changed, so that the state of the fluid flowing in each region can be adjusted for each region (specifically, for each of the spaces 60, 62) in order to enhance uniformity of an in-plane temperature of the placement surface of the placement section 10 on which a heat transfer target is placed. Moreover, the space formed in the housing 40 is demarcated, by the partition members, into a plurality of regions (that is, the first space 60 and the second space 62) that form substantially concentric circles. Fluid flows in each of the regions such that fluids in the adjacent regions flow in opposite directions. In this case, since fluids in the adjacent regions flow in opposite directions, heat of the fluids flowing in the spaces 60, 62 is uniformly transferred to the heat transfer section 30, so that uniformity of an in-plane temperature of the placement surface of the placement section 10 can be more effectively enhanced. In another embodiment, the space formed in the housing 40 may be demarcated by partition members into a plurality of regions that form substantially concentric circles with three or more circles instead of two circles. In still another embodiment, when the space formed in the housing 40 is demarcated by the partition members into a plurality of regions with substantially concentric circles, fluid may flow in each of the regions such that fluids in adjacent regions flow in the same direction.

[Second Temperature Control Unit]

Figure 4:
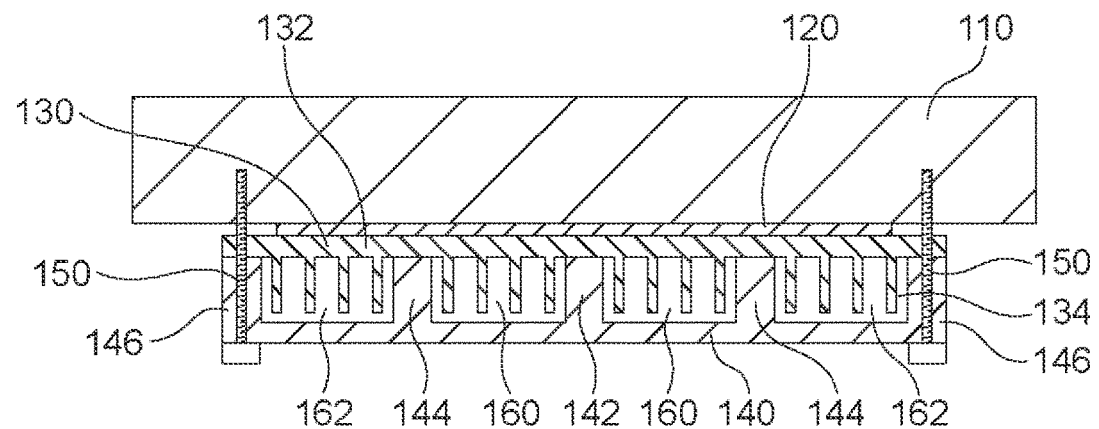
FIG. 4 is a lengthwise cross-sectional view of a configuration of a second temperature control unit according to an embodiment of the present invention.

Next, a second temperature control unit of the present embodiment will be described with reference to FIG. 4. FIG. 4 is a lengthwise cross-sectional view of a configuration of the second temperature control unit according to an embodiment of the present invention. The internal structure of the second temperature control unit as viewed from thereabove is substantially the same as the internal structure of the first temperature control unit in FIG. 1 as viewed from thereabove, and the description thereof is omitted.

As illustrated in FIG. 4, the second temperature control unit according to the present embodiment includes a substantially flat-plate-shaped placement section 110 on which a heat transfer target is to be placed, a heating section 120 for heating the heat transfer target placed on the placement section 110, a heat transfer section 130 that is disposed in contact with the heating section 120 and is at least partially formed of the metal porous structure, and a housing 140 having therein a flow path in which fluid flows.

The placement section 110 is formed of, for example, a heat-conductive material that is substantially flat-plate-shaped and has a substantially round shape as viewed from thereabove. The specific configuration of the placement section 110 is substantially the same as that of the placement section 10 of the first temperature control unit.

The specific configuration of the heating section 120 is substantially the same as that of the heating section 20 of the first temperature control unit. Unlike the first temperature control unit, the heating section 120 is not housed in a recess of the heat transfer section and is disposed between the placement section 10 and the heat transfer section 130 in the second temperature control unit.

The heat transfer section 130 has a substantially flat-plate-shaped base portion 132 disposed in contact with the heating section, and a plurality of protruding members 134 that protrude from the base portion 132. The specific configuration of the heat transfer section 130 having such a structure is substantially the same as that of the heat transfer section 130 of the first temperature control unit. Specifically, the plurality of protruding members 134 are each bar-shaped, and extend downward from the lower surface of the base portion 132. More specifically, the protruding members 134 each extend in the direction orthogonal to the lower surface of the base portion 132 and the protruding members 134 extend in directions parallel to each other. Unlike the first temperature control unit, the heat transfer section 130 does not have a recess for housing the heating section 120 in the second temperature control unit.

The housing 140 houses the heat transfer section 130, more specifically, the protruding members 134 between the placement section 110 and the housing 140. The housing 140 is formed to have therein spaces 160, 162 configured to allow fluid to flow, such as water, air, or Fluorinert serving as a cooling medium or a heating medium. Fluid as a cooling medium or a heating medium flows in the spaces 160, 162 formed in the housing 140 having such a structure, whereby heat of the fluid is transferred to a heat transfer target placed on the placement section 110 through the heat transfer section 130, the heating section 120, and the placement section 110. The protruding members 134 are in the spaces 160, 162 formed in the housing 140, whereby efficiency of transferring heat by the heat transfer section 130 can be enhanced.

More specifically, as illustrated in FIG. 4, the housing 140 has a first partition member 142, a second partition member 144, and a third partition member 146. The first space 160 is formed between the first partition member 142 and the second partition member 144, and the second space 162 is formed between the second partition member 144 and the third partition member 146. The first space 160 and the second space 162 are demarcated by the second partition member 144 so as not to connect to each other. Similarly to the first temperature control unit illustrated in FIG. 1 to FIG. 3, each of the first space 160 and the second space 162 forms an annular flow path. That is, the space formed in the housing 140 is demarcated, by the partition members 142, 144, 146, into a plurality of regions (two spaces 160, 162) that form substantially concentric circles. Fluid as a cooling medium or a heating medium is sent into the first space 160 through a first introduction pipe (not illustrated), and the fluid flows counterclockwise in the annular first space 160 as viewed from thereabove, and is discharged through a first discharge pipe (not illustrated). Meanwhile, fluid as a cooling medium or a heating medium is sent into the second space 162 through a second introduction pipe (not illustrated), and the fluid flows clockwise in the annular second space 162 as viewed from thereabove, and is discharged through a second discharge pipe (not illustrated). Thus, fluid flows in each of the regions such that fluids in adjacent regions (two spaces 160, 162) flow in opposite directions. Thus, the heat transfer target can be uniformly cooled or heated by the fluids flowing in the spaces 160, 162, through the heat transfer section 130, the heating section 120, and the placement section 110.

In the second temperature control unit, the housing 140 is mechanically mounted to the placement section 110 by a plurality of mounting members 150 such as bolts in a state where the heat transfer section 130 is housed.

Also in the second temperature control unit as illustrated in FIG. 4, similarly to the first temperature control unit illustrated in FIG. 1 to FIG. 3, at least a part of the heat transfer section 130 disposed in contact with the heating section 120 is formed of the metal porous structure. Therefore, in a case where a temperature rising rate is changed when the heat transfer target is heated by the heating section 120, since at least a part of the heat transfer section 130 is formed of the metal porous structure, a sufficient heat transfer effect can be obtained, and responsiveness is thus enhanced, thereby shortening takt time. In the case of using the heat transfer section 130 that is at least partially formed of the metal porous structure, when the heating section 120 is extended/contracted, the heat transfer section 130 is also extended/contracted according thereto, and a gap can be thus prevented from being partially generated between the heat transfer section 130 and the heating section 120, and uniformity of an in-plane temperature of the placement surface of the placement section 110 on which a heat transfer target is placed can be enhanced, as compared with a case of using a heat transfer section formed of a solid material instead of a porous material.

[Third Temperature Control Unit]

Figure 5:
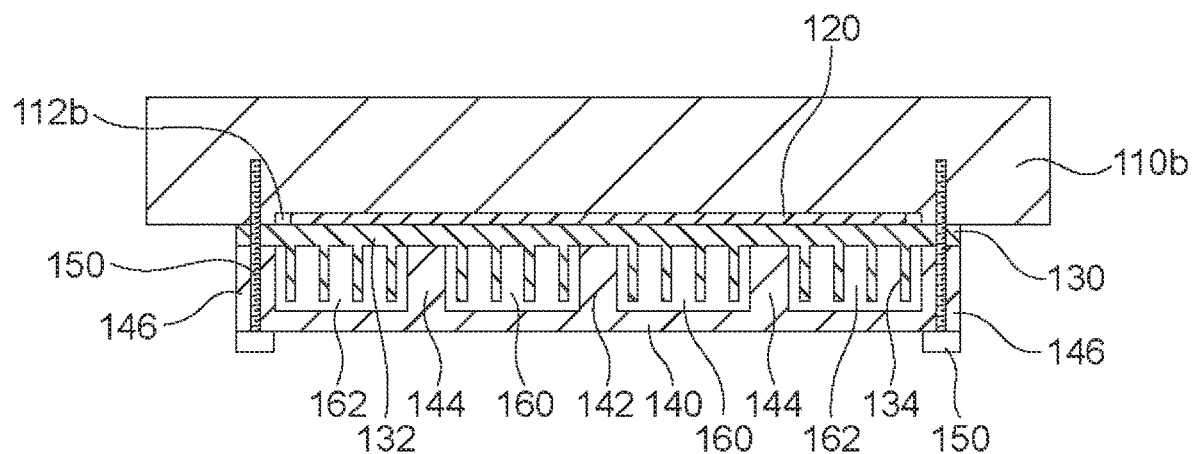
FIG. 5 is a lengthwise cross-sectional view of a configuration of a third temperature control unit according to an embodiment of the present invention.

Next, a third temperature control unit of the present embodiment will be described with reference to FIG. 5. FIG. 5 is a lengthwise cross-sectional view of a configuration of the third temperature control unit according to an embodiment of the present invention. The internal structure of the third temperature control unit as viewed from thereabove is substantially the same as the internal structure of the first temperature control unit in FIG. 1 as viewed from thereabove, and the description thereof is omitted. In the description of the third temperature control unit illustrated in FIG. 5, the same components as those of the second temperature control unit illustrated in FIG. 4 are denoted by the same reference characters, and the description thereof is omitted.

As illustrated in FIG. 5, the third temperature control unit according to the present embodiment includes the substantially flat-plate-shaped placement section 110 on which a heat transfer target is to be placed, the heating section 120 for heating the heat transfer target placed on the placement section 110, a heat transfer section 130a that is disposed in contact with the heating section 120 and that is at least partially formed of the metal porous structure, and the housing 140 having therein a flow path in which fluid flows. The configurations of the placement section 110, the heating section 120, the housing 140, and the mounting members 150 of the third temperature control unit are substantially the same as the configurations of the placement section 110, the heating section 120, the housing 140, and the mounting members 150 of the second temperature control unit.

The heat transfer section 130a has a substantially flat-plate-shaped base portion 132a disposed in contact with the heating section and a plurality of protruding members 134a that protrude from the base portion 132a. The base portion 132a has a recess 136a for housing the heating section 120, and the heating section 120 is housed in the recess 136a. A region on the upper surface of the base portion 132a other than the recess 136a is in contact with the lower surface of the placement section 110. As illustrated in FIG. 5, the upper surface and the lower surface of the heating section 120 housed in the recess 136a are in contact with the placement section 110 and the base portion 132a, respectively. The plurality of protruding members 134a are each bar-shaped, and extend downward from the lower surface of the base portion 132a. More specifically, the protruding members 134a each extend in the direction orthogonal to the lower surface of the base portion 132a and the protruding members 134a extend in directions parallel to each other.

Also in the third temperature control unit illustrated in FIG. 5, similarly to the first temperature control unit illustrated in FIG. 1 to FIG. 3, at least a part of the heat transfer section 130a disposed in contact with the heating section 120 is formed of the metal porous structure. Therefore, in a case where a temperature rising rate is changed when a heat transfer target is heated by the heating section 120, since at least a part of the heat transfer section 130a is formed of the metal porous structure, a sufficient heat transfer effect can be obtained, and responsiveness is thus enhanced, thereby shortening takt time. In the case of using the heat transfer section 130a that is at least partially formed of the metal porous structure, when the placement section 110 or the heating section 120 is extended/contracted, the heat transfer section 130a is also extended/contracted according thereto, and a gap can be thus prevented from being partially generated between the heat transfer section 130a and the placement section 110 or the heating section 120, and uniformity of an in-plane temperature of the placement surface of the placement section 110 on which a heat transfer target is placed can be enhanced, as compared with a case of using a heat transfer section formed of a solid material instead of a porous material.

[Fourth Temperature Control Unit]

Figure 6:
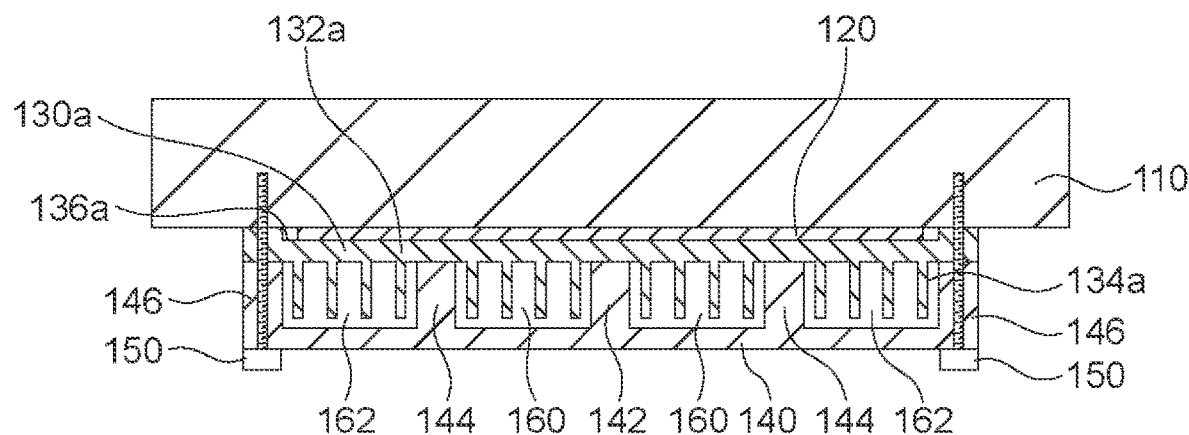
FIG. 6 is a lengthwise cross-sectional view of a configuration of a fourth temperature control unit according to an embodiment of the present invention.

Next, a fourth temperature control unit of the present embodiment will be described with reference to FIG. 6. FIG. 6 is a lengthwise cross-sectional view of a configuration of the fourth temperature control unit according to an embodiment of the present invention. The internal structure of the fourth temperature control unit as viewed from thereabove is substantially the same as the internal structure of the first temperature control unit in FIG. 1 as viewed from thereabove, and the description thereof is omitted. In the description of the fourth temperature control unit illustrated in FIG. 6, the same components as those of the second temperature control unit illustrated in FIG. 4 are denoted by the same reference characters, and the description thereof is omitted.

As illustrated in FIG. 6, the fourth temperature control unit according to the present embodiment includes a substantially flat-plate-shaped placement section 110b on which a heat transfer target is to be disposed, the heating section 120 for heating the heat transfer target placed on the placement section 110b, the heat transfer section 130 that is disposed in contact with the heating section 120 and is at least partially formed of the metal porous structure, and the housing 140 having therein a flow path in which fluid flows. The configurations of the heating section 120, the heat transfer section 130, the housing 140, and the mounting members 150 of the fourth temperature control unit are substantially the same as the configurations of the heating section 120, the heat transfer section 130, the housing 140, and the mounting members 150 of the second temperature control unit.

The placement section 110b is formed of, for example, a heat-conductive material that is substantially flat-plate-shaped and has a substantially round shape as viewed from thereabove. The placement section 110b has a recess 112b for housing the heating section 120, and the heating section 120 is housed in the recess 112b. A region on the lower surface of the placement section 110b other than the recess 112b is in contact with the upper surface of the heat transfer section 130. As illustrated in FIG. 6, the upper surface and the lower surface of the heating section 120 housed in the recess 112b are in contact with the placement section 110b and the base portion 132 of the heat transfer section 130, respectively.

Also in the fourth temperature control unit illustrated in FIG. 6, similarly to the first temperature control unit illustrated in FIG. 1 to FIG. 3, at least a part of the heat transfer section 130 disposed in contact with the heating section 120 is formed of the metal porous structure. Therefore, in a case where a temperature rising rate is changed when a heat transfer target is heated by the heating section 120, since at least a part of the heat transfer section 130 is formed of the metal porous structure, a sufficient heat transfer effect can be obtained, and responsiveness is thus enhanced, thereby shortening takt time. In the case of using the heat transfer section 130 that is at least partially formed of the metal porous structure, when the placement section 110b or the heating section 120 is extended/contracted, the heat transfer section 130 is also extended/contracted according thereto, and a gap can be thus prevented from being partially generated between the heat transfer section 130 and the placement section 110b or the heating section 120, and uniformity of an in-plane temperature of the placement surface of the placement section 110b on which a heat transfer target is placed can be enhanced, as compared with a case of using a heat transfer section formed of a solid material instead of a porous material.

[Fifth Temperature Control Unit]

Figure 7:
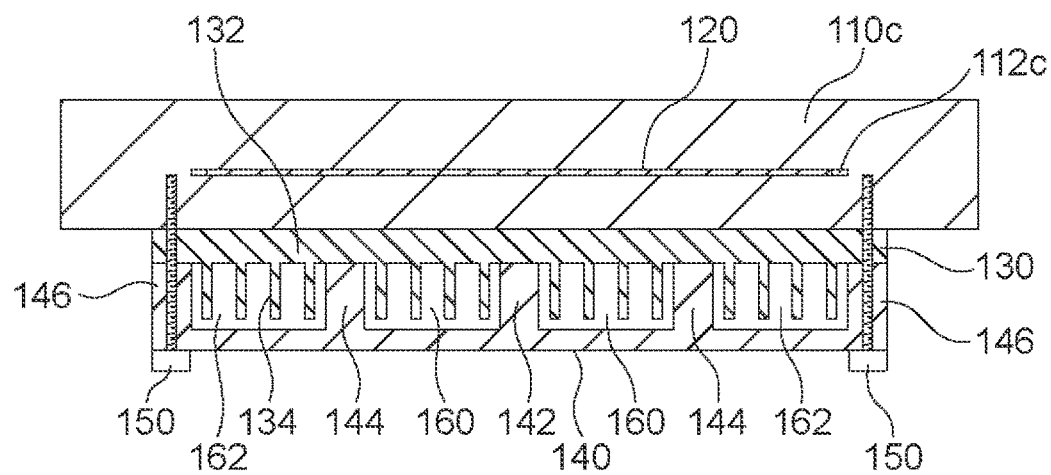
FIG. 7 is a lengthwise cross-sectional view of a configuration of a fifth temperature control unit according to an embodiment of the present invention.

Next, a fifth temperature control unit of the present embodiment will be described with reference to FIG. 7. FIG. 7 is a lengthwise cross-sectional view of a configuration of the fifth temperature control unit according to an embodiment of the present invention. The internal structure of the fifth temperature control unit as viewed from thereabove is substantially the same as the internal structure of the first temperature control unit in FIG. 1 as viewed from thereabove, and the description thereof is omitted. In the description of the fifth temperature control unit illustrated in FIG. 7, the same components as those of the second temperature control unit illustrated in FIG. 4 are denoted by the same reference characters, and the description thereof is omitted.

As illustrated in FIG. 7, the fifth temperature control unit according to the present embodiment includes a substantially flat-plate-shaped placement section 110c on which a heat transfer target is to be placed, the heating section 120 for heating the heat transfer target placed on the placement section 110c, the heat transfer section 130 that is disposed in contact with the placement section 110 and is at least partially formed of the metal porous structure, and the housing 140 having therein a flow path in which fluid flows. The configurations of the heating section 120, the heat transfer section 130, the housing 140, and the mounting members 150 of the fifth temperature control unit are substantially the same as the configurations of the heating section 120, the heat transfer section 130, the housing 140, and the mounting members 150 of the second temperature control unit.

The placement section 110c is formed of, for example, a heat-conductive material that is substantially flat-plate-shaped and has a substantially round shape as viewed from thereabove. The placement section 110c is formed to have therein a space 112c for housing the heating section 120, and the heating section 120 is housed in the space 112c. The lower surface of the placement section 110c is in contact with the upper surface of the heat transfer section 130.

In the fifth temperature control unit illustrated in FIG. 7, at least a part of the heat transfer section 130 disposed in contact with the placement section 110c is formed of the metal porous structure. Therefore, in a case where a temperature rising rate is changed when a heat transfer target is heated by the heating section 120, since at least a part of the heat transfer section 130 is formed of the metal porous structure, a sufficient heat transfer effect can be obtained, and responsiveness is thus enhanced, thereby shortening takt time. In the case of using the heat transfer section 130 that is at least partially formed of the metal porous structure, when the placement section 110c is extended/contracted, the heat transfer section 130 is also extended/contracted according thereto, and a gap can be thus prevented from being partially generated between the heat transfer section 130 and the placement section 110c, and uniformity of an in-plane temperature of the placement surface of the placement section 110c on which the heat transfer target is placed can be enhanced, as compared with a case of using a heat transfer section formed of a solid material instead of a porous material.

[Sixth Temperature Control Unit]

Figure 8:
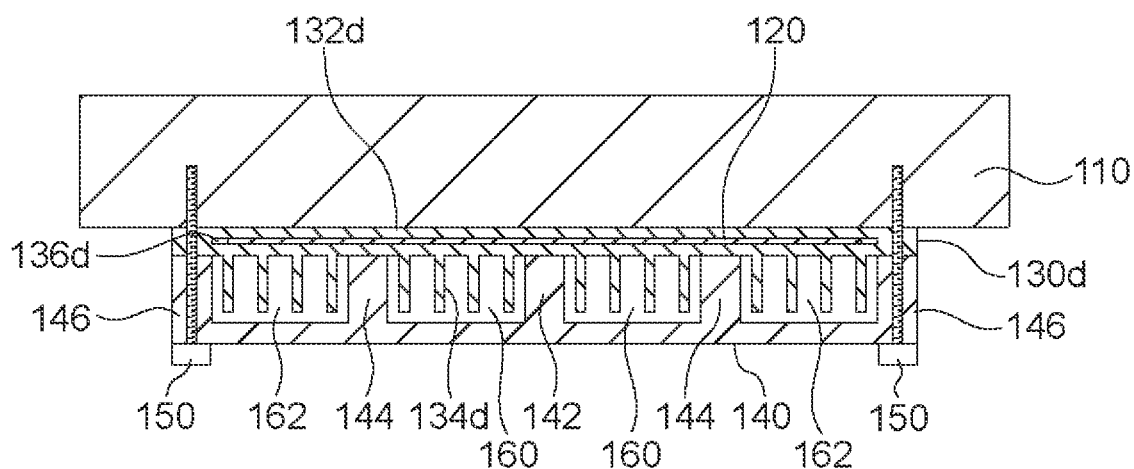
FIG. 8 is a lengthwise cross-sectional view of a configuration of a sixth temperature control unit according to an embodiment of the present invention.

Next, a sixth temperature control unit of the present embodiment will be described with reference to FIG. 8. FIG. 8 is a lengthwise cross-sectional view of a configuration of the sixth temperature control unit according to an embodiment of the present invention. The internal structure of the sixth temperature control unit as viewed from thereabove is substantially the same as the internal structure of the first temperature control unit in FIG. 1 as viewed from thereabove, and the description thereof is omitted. In the description of the sixth temperature control unit illustrated in FIG. 8, the same components as those of the second temperature control unit illustrated in FIG. 4 are denoted by the same reference characters, and the description thereof is omitted.

As illustrated in FIG. 8, the sixth temperature control unit according to the present embodiment includes the substantially flat plate-shaped placement section 110 on which a heat transfer target is to be placed, the heating section 120 for heating the heat transfer target placed on the placement section 110, a heat transfer section 130d that is disposed in contact with the placement section 110 and is at least partially formed of the metal porous structure, and the housing 140 having therein a flow path in which fluid flows. The configurations of the placement section 110, the heating section 120, the housing 140, and the mounting members 150 of the sixth temperature control unit are substantially the same as the configurations of the placement section 110, the heating section 120, the housing 140, and the mounting members 150 of the second temperature control unit.

The heat transfer section 130d has a substantially flat-plate-shaped base portion 132d disposed in contact with the heating section, and a plurality of protruding members 134d that protrude from the base portion 132d. Specifically, the plurality of protruding members 134d are each bar-shaped, and extend downward from the lower surface of the base portion 132d. More specifically, the protruding members 134d each extend in the direction orthogonal to the lower surface of the base portion 132d, and the protruding members 134d extend in directions parallel to each other. The upper surface of the heat transfer section 130d is in contact with the lower surface of the placement section 110. In the base portion 132d, a space 136d for housing the heating section 120 is formed, and the heating section 120 is housed in the space 136d.

Also in the sixth temperature control unit illustrated in FIG. 8, similarly to the fifth temperature control unit illustrated in FIG. 7, at least a part of the heat transfer section 130d disposed in contact with the placement section 110 is formed of the metal porous structure. Therefore, in a case where a temperature rising rate is changed when a heat transfer target is heated by the heating section 120, since at least a part of the heat transfer section 130d is formed of the metal porous structure, a sufficient heat transfer effect can be obtained, and responsiveness is thus enhanced, thereby shortening takt time. In the case of using the heat transfer section 130d that is at least partially formed of the metal porous structure, when the placement section 110 is extended/contracted, the heat transfer section 130d is also extended/contracted according thereto, and a gap can be thus prevented from being partially generated between the heat transfer section 130d and the placement section 110, and uniformity of an in-plane temperature of the placement surface of the placement section 110 on which a heat transfer target is placed can be enhanced, as compared with a case of using a heat transfer section formed of a solid material instead of a porous material.

[Seventh Temperature Control Unit]

Figure 9:
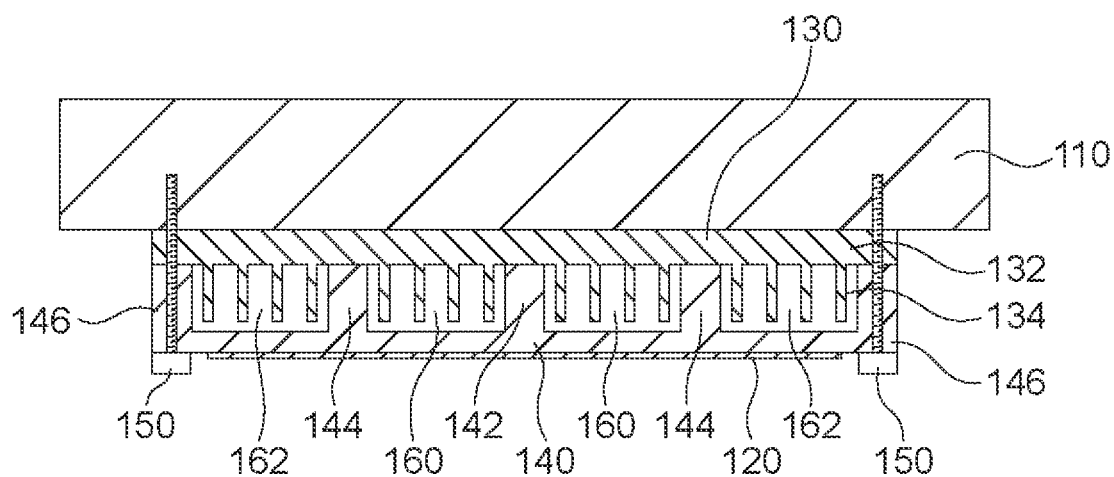
FIG. 9 is a lengthwise cross-sectional view of a configuration of a seventh temperature control unit according to an embodiment of the present invention.

Next, a seventh temperature control unit of the present embodiment will be described with reference to FIG. 9. FIG. 9 is a lengthwise cross-sectional view of a configuration of the seventh temperature control unit according to an embodiment of the present invention. The internal structure of the seventh temperature control unit as viewed from thereabove is substantially the same as the internal structure of the first temperature control unit in FIG. 1 as viewed from thereabove, and the description thereof is omitted. In the description of the seventh temperature control unit illustrated in FIG. 9, the same components as those of the second temperature control unit illustrated in FIG. 4 are denoted by the same reference characters, and the description thereof is omitted.

As illustrated in FIG. 9, the seventh temperature control unit according to the present embodiment includes the substantially flat-plate-shaped placement section 110 on which a heat transfer target is to be placed, the heating section 120 for heating the heat transfer target placed on the placement section 110, the heat transfer section 130 that is disposed in contact with the placement section 110 and is at least partially formed of the metal porous structure, and a housing 140e having therein a flow path in which fluid flows. The configurations of the placement section 110, the heating section 120, the heat transfer section 130, and the mounting members 150 of the sixth temperature control unit are substantially the same as the configurations of the placement section 110, the heating section 120, the heat transfer section 130, and the mounting members 150 of the second temperature control unit.

The housing 140e houses the heat transfer section 130, more specifically, the protruding members 134 between the placement section 110 and the housing 140e. The housing 140e is formed to have the spaces 160, 162 configured to allow fluid to flow, such as water, air, and Fluorinert serving as a cooling medium or a heating medium. Fluid as a cooling medium or a heating medium flows in the spaces 160, 162 formed in the housing 140e having such a structure, whereby heat of the fluid is transferred to a heat transfer target placed on the placement section 110 through the heat transfer section 130, the heating section 120, and the placement section 110. The protruding members 134 are in the spaces 160, 162 formed in the housing 140e, whereby efficiency for transferring heat by the heat transfer section 130 can be enhanced. More specifically, as illustrated in FIG. 8, the housing 140e has a first partition member 142e, a second partition member 144e, and a third partition member 146e. The first space 160 is formed between the first partition member 142e and the second partition member 144e, and the second space 162 is formed between the second partition member 144e and the third partition member 146e. The first space 160 and the second space 162 are demarcated by the second partition member 144e so as not to connect to each other. Similarly to the first temperature control unit illustrated in FIG. 1 to FIG. 3, each of the first space 160 and the second space 162 forms an annular flow path. That is, the space formed in the housing 140e is demarcated, by the partition members 142e, 144e, 146e, into a plurality of regions (two spaces 160, 162) that form substantially concentric circles. Heat of the fluid flowing in the spaces 160, 162 can be transferred to the heat transfer target through the heat transfer section 130 and the placement section 110. In the housing 140e, a space 148e is formed, and the heating section 120 is housed in the space 148e.

Also in the seventh temperature control unit illustrated in FIG. 9, similarly to the fifth temperature control unit illustrated in FIG. 7, at least a part of the heat transfer section 130 disposed in contact with the placement section 110 is formed of the metal porous structure. Therefore, in a case where a temperature rising rate is changed when a heat transfer target is heated by the heating section 120, since at least a part of the heat transfer section 130 is formed of the metal porous structure, a sufficient heat transfer effect can be obtained, and responsiveness is thus enhanced, thereby shortening takt time. In the case of using the heat transfer section 130 that is at least partially formed of the metal porous structure, when the placement section 110 is extended/contracted, the heat transfer section 130 is also extended/contracted according thereto, and a gap can be thus prevented from being partially generated between the heat transfer section 130 and the placement section 110, and uniformity of an in-plane temperature of the placement surface of the placement section 110 on which a heat transfer target is placed can be enhanced, as compared with a case of using a heat transfer section formed of a solid material instead of a porous material.

[Eighth Temperature Control Unit]

Figure 10:
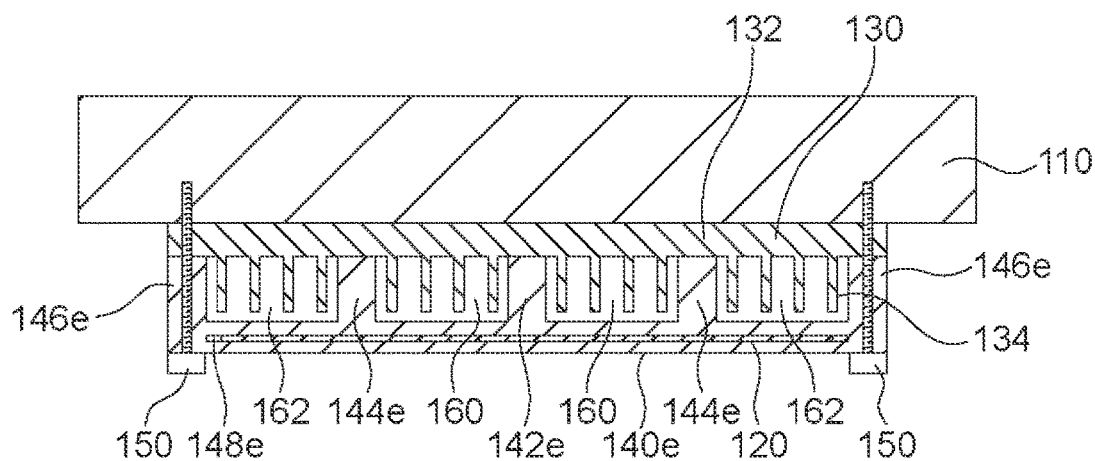
FIG. 10 is a lengthwise cross-sectional view of a configuration of an eighth temperature control unit according to an embodiment of the present invention.

Next, an eighth temperature control unit of the present embodiment will be described with reference to FIG. 10. FIG. 10 is a lengthwise cross-sectional view of a configuration of the eighth temperature control unit according to an embodiment of the present invention. The internal structure of the eighth temperature control unit as viewed from thereabove is substantially the same as the internal structure of the first temperature control unit in FIG. 1 as viewed from thereabove, and the description thereof is omitted. In the description of the eighth temperature control unit illustrated in FIG. 10, the same components as those of the second temperature control unit illustrated in FIG. 4 are denoted by the same reference characters, and the description thereof is omitted.

As illustrated in FIG. 10, the eighth temperature control unit according to the present embodiment includes the substantially flat-plate-shaped placement section 110 on which a heat transfer target is to be placed, the heating section 120 for heating the heat transfer target placed on the placement section 110, the heat transfer section 130 that is disposed in contact with the placement section 110 and is at least partially formed of the metal porous structure, and the housing 140 having therein a flow path in which fluid flows. Although the configurations of the placement section 110, the heating section 120, the heat transfer section 130, the housing 140, and the mounting members 150 of the eighth temperature control unit are substantially the same as the configurations of the placement section 110, the heating section 120, the heat transfer section 130, the housing 140, and the mounting members 150 of the second temperature control unit, the heating section 120 is mounted to the lower surface of the housing 140 and is not disposed between the placement section 110 and the heat transfer section 130, and the lower surface of the placement section 110 and the upper surface of the heat transfer section 130 are in contact with each other.

Also in the eighth temperature control unit illustrated in FIG. 10, similarly to the fifth temperature control unit illustrated in FIG. 7, at least a part of the heat transfer section 130 disposed in contact with the placement section 110 is formed of the metal porous structure. Therefore, in a case where a temperature rising rate is changed when a heat transfer target is heated by the heating section 120, since at least a part of the heat transfer section 130 is formed of the metal porous structure, a sufficient heat transfer effect can be obtained, and responsiveness is thus enhanced, thereby shortening takt time. In the case of using the heat transfer section 130 that is at least partially formed of the metal porous structure, when the placement section 110 is extended/contracted, the heat transfer section 130 is also extended/contracted according thereto, and a gap can be thus prevented from being partially generated between the heat transfer section 130 and the placement section 110, and uniformity of an in-plane temperature of the placement surface of the placement section 110 on which a heat transfer target is placed can be enhanced, as compared with a case of using a heat transfer section formed of a solid material instead of a porous material.

[Ninth Temperature Control Unit]

Figure 11:
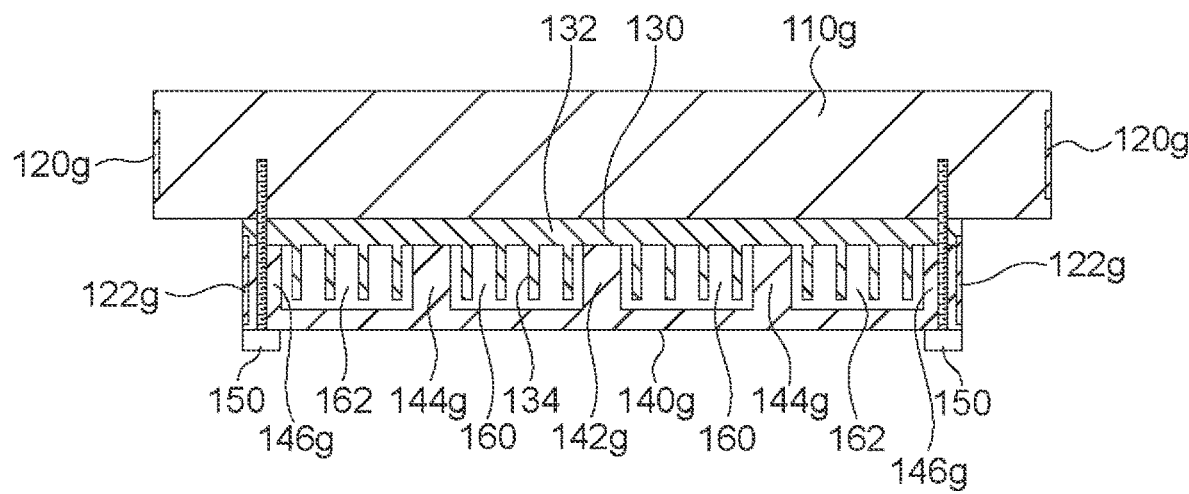
FIG. 11 is a lengthwise cross-sectional view of a configuration of a ninth temperature control unit according to an embodiment of the present invention.

Next, a ninth temperature control unit of the present embodiment will be described with reference to FIG. 11. FIG. 11 is a lengthwise cross-sectional view of a configuration of the ninth temperature control unit according to an embodiment of the present invention. The internal structure of the ninth temperature control unit as viewed from thereabove is substantially the same as the internal structure of the first temperature control unit in FIG. 1 as viewed from thereabove, and the description thereof is omitted. In the description of the ninth temperature control unit illustrated in FIG. 11, the same components as those of the second temperature control unit illustrated in FIG. 4 are denoted by the same reference characters, and the description thereof is omitted.

As illustrated in FIG. 11, the ninth temperature control unit according to the present embodiment includes a substantially flat-plate-shaped placement section 110 on which a heat transfer target is to be placed, an upper set of heating sections 120g and a lower set of heating sections 120g for heating the heat transfer target placed on the placement section 110, the heat transfer section 130 that is disposed in contact with the placement section 110 and is at least partially formed of the metal porous structure, and a housing 140 having therein a flow path in which fluid flows. Although the configurations of the placement section 110, the heat transfer section 130, the housing 140, and the mounting members 150 of the ninth temperature control unit are substantially the same as the configurations of the placement section 110, the heat transfer section 130, the housing 140, and the mounting members 150 of the second temperature control unit, the upper sets of heating sections 120g and the lower set of heating sections 120g are mounted to the side surfaces of the placement section 110 and the housing 140, respectively, and the lower surface of the placement section 110 and the upper surface of the heat transfer section 130 are in contact with each other.

Also in the ninth temperature control unit illustrated in FIG. 11, similarly to the fifth temperature control unit illustrated in FIG. 7, at least a part of the heat transfer section 130 disposed in contact with the placement section 110 is formed of the metal porous structure. Therefore, in a case where a temperature rising rate is changed when the heat transfer target is heated by each of the heating sections 120g, since at least a part of the heat transfer section 130 is formed of the metal porous structure, a sufficient heat transfer effect can be obtained, and responsiveness is thus enhanced, thereby shortening takt time. In the case of using the heat transfer section 130 that is at least partially formed of the metal porous structure, when the placement section 110 is extended/contracted, the heat transfer section 130 is also extended/contracted according thereto, and a gap can be thus prevented from being partially generated between the heat transfer section 130 and the placement section 110, and uniformity of an in-plane temperature of the placement surface of the placement section 110 on which a heat transfer target is placed can be enhanced, as compared with a case of using a heat transfer section formed of a solid material instead of a porous material.

The temperature control units according to the present embodiments are not limited to the above-described configurations, and various modifications can be made.

For example, the heat transfer section is not limited to the heat transfer section that has the base member and the plurality of protruding members. The heat transfer section to be employed may have another configuration as long as the heat transfer section is disposed in contact with at least one of the placement section and the heating section(s).

In still another embodiment, the temperature control unit to be employed may not necessarily include a housing formed to have therein a space in which fluid such as a heating medium or a cooling medium flows. In this case, in order to change a temperature rising rate when a heat transfer target is heated by the heating section(s), for example, fluid such as a heating medium or a cooling medium is brought into direct contact with the heat transfer section, or the heat transfer section is exposed to outside air, whereby heat of the fluid or outside air having been brought into contact with the heat transfer section is transferred to the heat transfer target placed on the placement section through the heat transfer section and the placement section. Also in this case, in a case where at least a part of the heat transfer section is formed of the metal porous structure, when a temperature rising rate is changed while a heat transfer target is being heated by the heating section(s), since at least a part of the heat transfer section is formed of the metal porous structure, a sufficient heat transfer effect can be obtained, and responsiveness is thus enhanced, thereby shortening takt time. In the case of using the heat transfer section that is at least partially formed of the metal porous structure, when the placement section or the heating section to which the heat transfer section is mounted is extended/contracted, the heat transfer section is also extended/contracted according thereto, and a gap can be thus prevented from being partially generated between the heat transfer section and the placement section or the heating section, and uniformity of an in-plane temperature of the placement surface of the placement section on which the heat transfer target is placed can be enhanced, as compared with a case of using a heat transfer section formed of a solid material instead of a porous material.

In still another embodiment, the heat transfer section may not necessarily be formed of the metal porous structure such as the metal fiber structure. Even if a non-porous solid metal body instead of the metal porous structure is used as the heat transfer section, suppose a case the housing houses the heat transfer section between the placement section and the housing, the housing has therein a space in which fluid flows, and the space formed in the housing is demarcated into a plurality of regions by partition portions. In this case also, uniformity of an in-plane temperature of the placement surface of the placement section on which the heat transfer target is placed can be enhanced by changing a state of the fluid (for example, kind, flow rate, temperature, or the like of the fluid) flowing in each region.

EXAMPLES

Example 1

Figure 12:
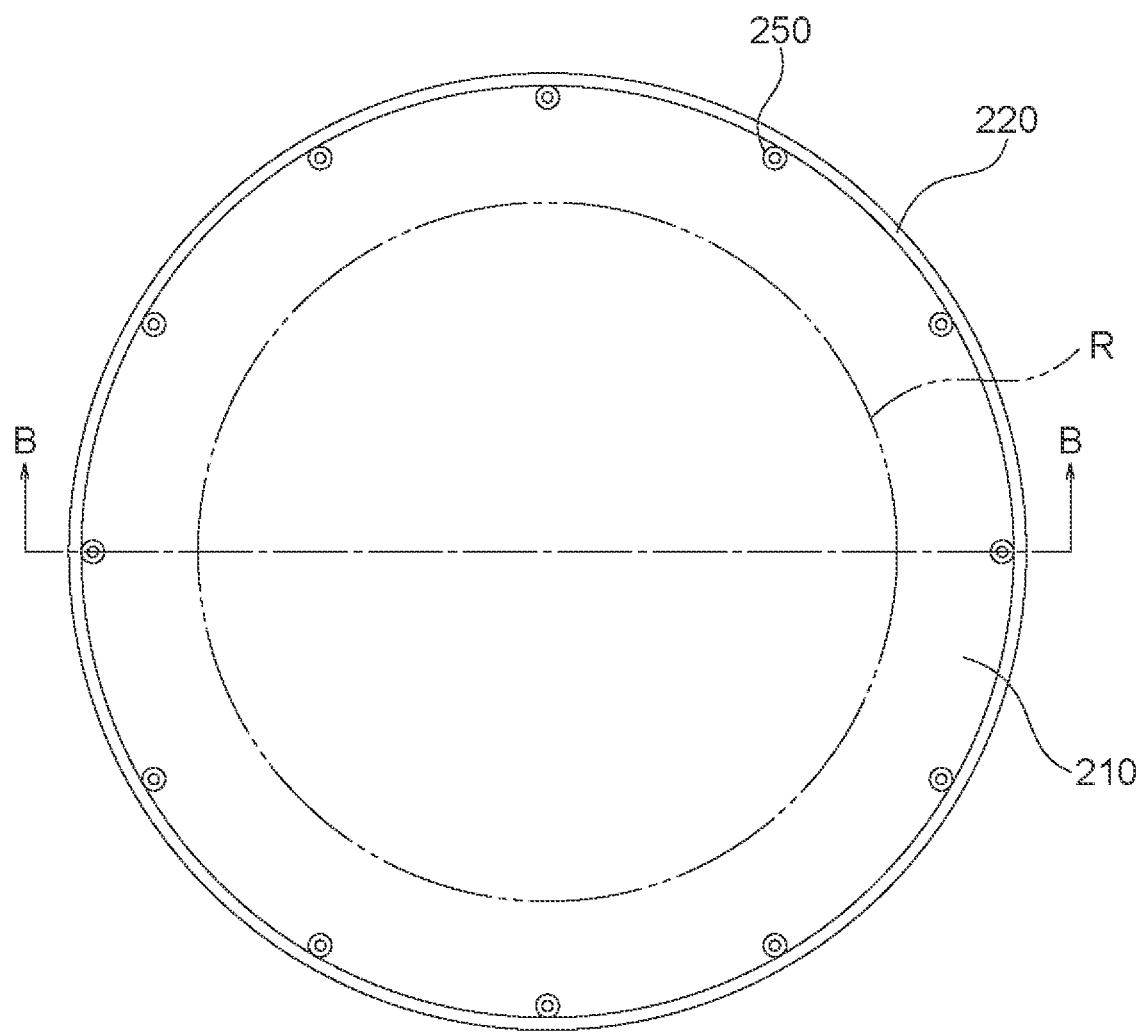
FIG. 12 is a top view of a configuration of a temperature control unit according to examples and comparative examples.
Figure 13:
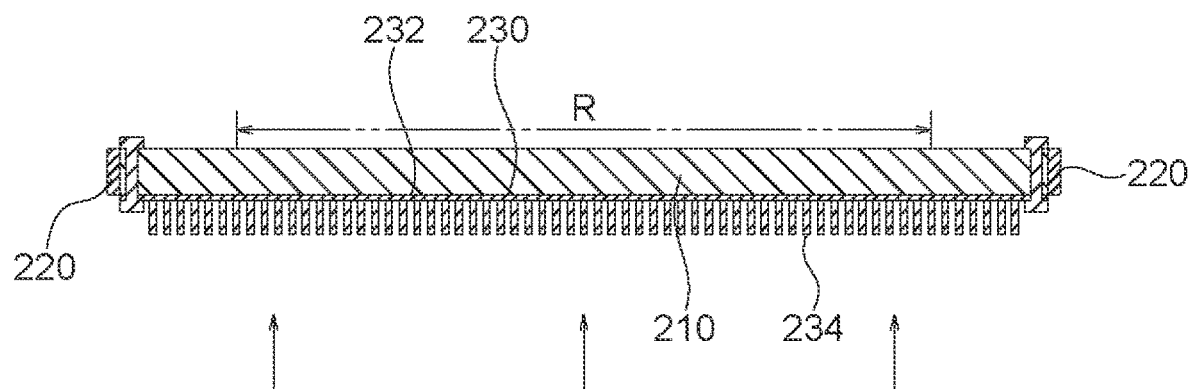
FIG. 13 is a cross-sectional view of the temperature control unit in FIG. 12 as seen in the direction of arrows B-B.

In a temperature control unit in which a housing for housing a heat transfer section was not provided as illustrated in FIG. 12 and FIG. 13, difference in in-plane temperature of the surface of the placement section was measured when air was uniformly sent to the surface of the heat transfer section while heating was performed by the heating section. FIG. 12 is a top view of a configuration of a temperature control unit according to examples and comparative examples. FIG. 13 is a cross-sectional view of the temperature control unit in FIG. 12 as seen in the direction of arrows B-B.

Specifically, the temperature control unit illustrated in FIG. 12 and FIG. 13 included an almost disc-shaped placement section 210 for placing a heat transfer target thereon, an annular heating section 220 disposed so as to cover the outer peripheral surface of the placement section 210 and heat the heat transfer target placed on the placement section 210, and a heat transfer section 230 that was disposed in contact with the placement section 210 and was at least partially formed of the metal porous structure. The heat transfer section 230 was mounted to the placement section 210 by a plurality of mounting members 250. Specifically, the heat transfer section 230 was screwed and mounted to the placement section 210 by the mounting members 250. The configurations of the placement section 210, the heating section 220, the heat transfer section 230, and the mounting members 250 of the temperature control unit were substantially the same as the configurations of the placement section 110g, the heating section 120g, the heat transfer section 130, and the mounting members 150 of the ninth temperature control unit, and the lower surface of the placement section 210 and the upper surface of the heat transfer section 230 were in contact with each other.

More specifically, the heat transfer section 230 had a substantially disc-shaped base member 232 disposed in contact with the placement section 210, and a plurality of protruding members 234 protruding downward from the lower surface of the base member 232. The base member 232 was, for example, mounted to the lower surface of the placement section 210 through a joining layer such as highly heat-conductive grease. The plurality of protruding members 234 were each bar-shaped, and extended downward from the lower surface of the base member 232. More specifically, the protruding members 234 each extended in the direction orthogonal to the lower surface of the base member 232, and the protruding members 234 extended in directions parallel to each other. Each of the protruding members 234 was disposed on a corresponding intersection point of a grid line.

In Example 1, the material of the placement section 210 was an aluminium bulk body, and the diameter was 400 mm, the thickness was 20 mm, and the flatness was 50 μm. For measuring the flatness, planes passing through three points that were distant over the maximum distance were set on the surface of the placement section 210, and the maximum value of the deviations was calculated as the flatness. Specifically, band-shaped laser light was applied to the surface of the placement section 210, and the reflected light was focused to form an image on a two-dimensional CMOS to measure the flatness.

As the base member 232 of the heat transfer section 230, a metal fiber structure formed of copper fibers was used. The base member 232 had a diameter of 400 mm, a thickness of 2 mm, and a flatness of 47 μm, and the space factor of the copper fibers in the metal fiber structure was 56%. The method for measuring the flatness of the base member 232 was the same as the method for measuring the flatness of the placement section 210. The space factor of the copper fibers is a proportion of a portion in which the copper fibers exist relative to a volume of the non-woven fabric of the copper fibers, and is calculated from the basis weight and the thickness of the non-woven fabric of the copper fibers, and the true density of the copper fibers, according to the following equation.

Space factor (%)=(basis weight of non-woven fabric of copper fibers/(thickness of non-woven fabric of copper fibers×true density of copper fibers)×100

As each of the protruding members 234 of the heat transfer section 230, a metal fiber structure formed of copper fibers was used. Each of the protruding members 234 had a diameter of 3 mm and a length of 15 mm, the number of the protruding members 234 was 7812, the occupancy of the protruding members 234 relative to the base member 232 was 50%, and the space factor was 51%. The occupancy of the protruding members 234 relative to the base member 232 refers to a proportion of the total contact area between the protruding members 234 and the base member 232, relative to an area of one surface of the base member 232. The method for measuring the space factor of the protruding members 234 was the same as the method for measuring the flatness of the base member 232.

As the heating section 220, a polyimide heater having power consumption of 200 W manufactured by Shinwa Rules Co., Ltd. was used.

Temperature difference in a region indicated by reference character R on the surface of the placement section 210 was measured when air was sent to the temperature control unit having such a structure at 100 L/minute from the lower side in FIG. 13 in the direction indicated by arrows. The difference between the highest temperature and the lowest temperature was 5.44° C. The region indicated by reference character R on the surface of the placement section 210 had a round shape and had a diameter of 300 mm. As the device for sending air, an air compressor manufactured by Takagi Co., Ltd. was used.

Example 2

Example 2 was different from Example 1 in that the heat transfer section 230 used in Example 2 had no protruding members 234, that is, the heat transfer section 230 merely had the base member 232. The configuration of the placement section 210 of Example 2 was the same as the configuration of the placement section 210 of Example 1 except that the flatness was 49 μm in Example 2. The configuration of the base member 232 of Example 2 was the same as the configuration of the base member 232 of Example 1 except that the flatness was 48 μm in Example 2. Temperature difference in the region indicated by reference character R on the surface of the placement section 210 was measured when air was sent to the temperature control unit having such a structure at 100 L/minute from the lower side in FIG. 13 in the direction indicated by arrows. The difference between the highest temperature and the lowest temperature was 2.18° C.

Example 3

In Example 3, the configuration of the placement section 210 was the same as the configuration of the placement section 210 of Example 1 except that the flatness was 49 μm in Example 3. Example 3 was different from Example 1 in that the base member 232 of the heat transfer section 230 of Example 3 was formed of a metal powder sintered body instead of a metal fiber structure. The base member 232 had a diameter of 400 mm, a thickness of 2 mm, and a flatness of 48 μm, and the space factor of copper powder in the metal powder sintered body was 87%. Furthermore, each of the protruding members 234 was formed of a metal powder sintered body instead of a metal fiber structure. Each of the protruding members 234 had a diameter of 3 mm and a length of 15 mm, the number of the protruding members 234 was 7812, the occupancy of the protruding members 234 relative to the base member 232 was 50%, and the space factor of copper powder in the metal powder sintered body was 51%. Temperature difference in the region indicated by reference character R on the surface of the placement section 210 was measured when air was sent to the temperature control unit having such a structure at 100 L/minute from the lower side in FIG. 13 in the direction indicated by arrows. The difference between the highest temperature and the lowest temperature was 7.62° C.

Example 4

Example 4 was different from Example 1 in that the heat transfer section 230 used in Example 4 had no protruding members 234, that is, the heat transfer section 230 merely had the base member 232. The configuration of the placement section 210 of Example 4 was the same as the configuration of the placement section 210 of Example 1 except that the flatness was 49 μm in Example 4. The configuration of the base member 232 of Example 4 was the same as the configuration of the base member 232 of Example 1 except that the space factor was 65% and the flatness was 50 μm in Example 4. Temperature difference in the region indicated by reference character R on the surface of the placement section 210 was measured when air was sent to the temperature control unit having such a structure at 100 L/minute from the lower side in FIG. 13 in the direction indicated by arrows. The difference between the highest temperature and the lowest temperature was 6.53° C.

Example 5

In Example 5, the configuration of the placement section 210 was the same as the configuration of the placement section 210 of Example 1 except that the flatness was 49 μm in Example 5. The base member 232 of the heat transfer section 230 was formed of a copper bulk body instead of a metal fiber structure. The base member 232 had a diameter of 400 mm, a thickness of 2 mm, a space factor of 100%, and a flatness of 50 μm. The configuration of each of the protruding members 234 of Example 5 was the same as the configuration of each of the protruding members 234 of Example 1 except that the space factor was 50% in Example 5. Temperature difference in the region indicated by reference character R on the surface of the placement section 210 was measured when air was sent to the temperature control unit having such a structure at 100 L/minute from the lower side in FIG. 13 in the direction indicated by arrows. The difference between the highest temperature and the lowest temperature was 8.71° C.

Example 6

Example 6 was different from Example 1 in that the material of the placement section 210 was a copper bulk body instead of an aluminium bulk body, and the diameter was 400 mm, the thickness was 20 mm, and the flatness was 49 μm in Example 6. The base member 232 of the heat transfer section 230 was formed of a copper bulk body instead of a metal fiber structure. The base member 232 had a diameter of 400 mm, a thickness of 2 mm, a space factor of 100%, and a flatness of 50 μm. The configuration of each of the protruding members 234 of Example 6 was the same as the configuration of each of the protruding members 234 of Example 1 except that the space factor was 50% in Example 6. Temperature difference in the region indicated by reference character R on the surface of the placement section 210 was measured when air was sent to the temperature control unit having such a structure at 100 L/minute from the lower side in FIG. 13 in the direction indicated by arrows. The difference between the highest temperature and the lowest temperature was 7.07° C.

Example 7

Example 7 was different from Example 1 in that the heat transfer section 230 used in Example 7 had no protruding members 234, that is, the heat transfer section 230 merely had the base member 232. The configuration of the placement section 210 of Example 7 was the same as the configuration of the placement section 210 of Example 1 except that the flatness was 47 μm in Example 7. The configuration of the base member 232 of Example 7 was the same as the configuration of the base member 232 of Example 1 except that the space factor was 59% and the flatness was 52 μm in Example 7. Temperature difference in the region indicated by reference character R on the surface of the placement section 210 was measured when air was sent to the temperature control unit having such a structure at 100 L/minute from the lower side in FIG. 13 in the direction indicated by arrows. The difference between the highest temperature and the lowest temperature was 2.72° C.

Comparative Example 1

Comparative example 1 was different from Example 1 in that the heat transfer section 230 used in Comparative example 1 had no protruding members 234, that is, the heat transfer section 230 merely had the base member 232. The configuration of the placement section 210 of Comparative example 1 was the same as the configuration of the placement section 210 of Example 1 except that the flatness was 51 μm in Comparative example 1. The base member 232 of the heat transfer section 230 was formed of a copper bulk body instead of a metal fiber structure. The base member 232 had a diameter of 400 mm, a thickness of 2 mm, a space factor of 100%, and a flatness of 49 μm. Temperature difference in the region indicated by reference character R on the surface of the placement section 210 was measured when air was sent to the temperature control unit having such a structure at 100 L/minute from the lower side in FIG. 13 in the direction indicated by arrows. The difference between the highest temperature and the lowest temperature was 14.15° C.

Comparative Example 2

In Comparative example 2, the configuration of the placement section 210 was the same as the configuration of the placement section 210 of Example 1. The base member 232 of the heat transfer section 230 was formed of a copper bulk body instead of a metal fiber structure. The base member 232 had a diameter of 400 mm, a thickness of 2 mm, a space factor of 100%, and a flatness of 48 μm. Each of the protruding members 234 was formed of a copper bulk body instead of a metal fiber structure. Each of the protruding members 234 had a diameter of 3 mm and a length of 15 mm, the number of the protruding members 234 was 7812, the occupancy of the protruding members 234 relative to the base member 232 was 50%, and the space factor was 100%. Temperature difference in the region indicated by reference character R on the surface of the placement section 210 was measured when air was sent to the temperature control unit having such a structure at 100 L/minute from the lower side in FIG. 13 in the direction indicated by arrows. The difference between the highest temperature and the lowest temperature was 16.32° C.

Comparative Example 3

Comparative example 3 was different from Example 1 in that the heat transfer section 230 used in Comparative example 3 had no protruding members 234, that is, the heat transfer section 230 merely had the base member 232. The configuration of the placement section 210 of Comparative example 3 was the same as the configuration of the placement section 210 of Example 1 except that the flatness was 49 μm in Comparative example 3. The base member 232 of the heat transfer section 230 was formed of a stainless steel bulk body instead of a metal fiber structure. The base member 232 had a diameter of 400 mm, a thickness of 2 mm, a space factor of 100%, and a flatness of 50 μm. Temperature difference in the region indicated by reference character R on the surface of the placement section 210 was measured when air was sent to the temperature control unit having such a structure at 100 L/minute from the lower side in FIG. 13 in the direction indicated by arrows. The difference between the highest temperature and the lowest temperature was 13.06° C.

Comparative Example 4

Comparative example 4 was different from Example 1 in that the material of the placement section 210 was a copper bulk body instead of an aluminium bulk body, and the diameter was 400 mm, the thickness was 20 mm, and the flatness was 49 μm in Comparative example 4. The base member 232 of the heat transfer section 230 was formed of a copper bulk body instead of a metal fiber structure. The base member 232 had a diameter of 400 mm, a thickness of 2 mm, a space factor of 100%, and a flatness of 50 μm. Temperature difference in the region indicated by reference character R on the surface of the placement section 210 was measured when air was sent to the temperature control unit having such a structure at 100 L/minute from the lower side in FIG. 13 in the direction indicated by arrows. The difference between the highest temperature and the lowest temperature was 10.88° C.

Comparative Example 5

Comparative example 5 was different from Example 1 in that the material of the placement section 210 was a copper bulk body instead of an aluminium bulk body, and the diameter was 400 mm, the thickness was 20 mm, and the flatness was 49 μm in Comparative example 5. The base member 232 of the heat transfer section 230 was formed of a copper bulk body instead of a metal fiber structure. The base member 232 had a diameter of 400 mm, a thickness of 2 mm, a space factor of 100%, and a flatness of 50 μm. Each of the protruding members 234 was formed of a copper bulk body instead of a metal fiber structure. Each of the protruding members 234 had a diameter of 3 mm and a length of 15 mm, the number of the protruding members 234 was 7812, the occupancy of the protruding members 234 relative to the base member 232 was 50%, and the space factor was 100%. Temperature difference in the region indicated by reference character R on the surface of the placement section 210 was measured when air was sent to the temperature control unit having such a structure at 100 L/minute from the lower side in FIG. 13 in the direction indicated by arrows. The difference between the highest temperature and the lowest temperature was 12.51° C.

In Examples 1 to 7 and Comparative examples 1 to 5, the temperature difference in the region indicated by reference character R on the surface of the placement section 210 is preferably 10° C. or less when air is sent to the temperature control unit at 100 L/minute from the lower side in the direction indicated by arrows, in order to enhance uniformity of an in-plane temperature of the placement surface of the placement section 210 for placing a heat transfer target thereon. Therefore, the temperature control unit was evaluated as "good" when the temperature difference was 10° C. or less, evaluated as "excellent" when the temperature difference was 5° C. or less, and evaluated as "poor" when the temperature difference was greater than 10° C. The results of Examples 1 to 7 and Comparative examples 1 to 5 are indicated below in Table 1 and Table 2.

TABLE 1

|  |  | Example 1 | Example 2 | Example 3 | Example 4 |
|---|---|---|---|---|---|
| Placement section | Material | Aluminium (bulk body) | Aluminium (bulk body) | Aluminium (bulk body) | Aluminium (bulk body) |
|  | Size | φ400 | φ400 | φ400 | φ400 |
|  | Thickness | 20 mm | 20 mm | 20 mm | 20 mm |
|  | Flatness | 50 μm | 49 μm | 49 μm | 49 μm |

TABLE 1-continued

|  |  | Example 1 | Example 2 | Example 3 | Example 4 |
|---|---|---|---|---|---|
| Heat transfer section (base member) | Material | Cu (metal fiber structure) | Cu (metal fiber structure) | Cu (metal powder sintered body) | SUS (metal fiber structure) |
|  | Size | φ400 | φ400 | φ400 | φ400 |
|  | Thickness | 2 mm | 2 mm | 2 mm | 2 mm |
|  | Space factor | 56% | 56% | 87% | 65% |
|  | Flatness | 47 μm | 48 μm | 48 μm | 50 μm |
| Heat transfer section (protruding member) | Material | Cu (metal fiber structure) |  | Cu (metal powder sintered body) |  |
|  | Size | φ3 |  | φ3 |  |
|  | Length | 15 mm |  | 15 mm |  |
|  | The number of protruding members (occupancy) | 7,812 (50%) |  | 7,812 (50%) |  |
|  | Space factor | 51% |  | 51% |  |
| Heating section | Power consumption | 200 W | 200 W | 200 W | 200 W |
| Cooling | Airflow rate | 100 L/min | 100 L/min | 100 L/min | 100 L/min |
| Difference in in-plane temperature (in region R) (Greatest temperature value − smallest temperature value) | 200 W | 5.44 | 2.18 | 7.62 | 6.53 |
|  | Evaluation | excellent | good | good | good |

TABLE 2

|  |  | Example 5 | Example 6 | Example 7 | Comparative example 1 |
|---|---|---|---|---|---|
| Placement section | Material | Aluminium (bulk body) | Cu (bulk body) | SUS (bulk body) | Aluminium (bulk body) |
|  | Size | φ400 | φ400 | φ400 | φ400 |
|  | Thickness | 20 mm | 20 mm | 20 mm | 20 mm |
|  | Flatness | 49 μm | 49 μm | 47 μm | 51 μm |
| Heat transfer section (base member) | Material | Cu (bulk body) | Cu (bulk body) | SUS (metal fiber structure) | Cu (bulk body) |
|  | Size | φ400 | φ400 | φ400 | φ400 |
|  | Thickness | 2 mm | 2 mm | 2 mm | 2 mm |
|  | Space Factor | 100% | 100% | 59% | 100% |
|  | Flatness | 50 μm | 50 μm | 52 μm | 49 μm |
| Heat transfer section (protruding member) | Material | Cu (metal fiber structure) | Cu (metal fiber structure) |  |  |
|  | Size | φ3 | φ3 |  |  |
|  | Length | 15 mm | 15 mm |  |  |
|  | The number of protruding members (occupancy) | 7,812 (50%) | 7,812 (50%) |  |  |
|  | Space factor | 50% | 50% |  |  |
| Heating section | Power consumption | 200 W | 200 W | 200 W | 200 W |
| Cooling | Airflow rate | 100 L/min | 100 L/min | 100 L/min | 100 L/min |
| Difference in in-plane temperature (in region R) (Greatest temperature value − smallest temperature value) | 200 W | 8.71 | 7.07 | 2.72 | 14.15 |
|  | Evaluation | good | good | excellent | poor |

TABLE 3

|  |  | Comparative example 2 | Comparative example 3 | Comparative example 4 | Comparative example 5 |
|---|---|---|---|---|---|
| Placement section | Material | Aluminium (bulk body) | Aluminium (bulk body) | Cu (bulk body) | Cu (bulk body) |
|  | Size | φ400 | φ400 | φ400 | φ400 |
|  | Thickness | 20 mm | 20 mm | 20 mm | 20 mm |
|  | Flatness | 50 μm | 49 μm | 49 μm | 49 μm |
| Heat transfer section (base member) | Material | Cu (bulk body) | SUS (bulk body) | Cu (bulk body) | Cu (bulk body) |
|  | Size | φ400 | φ400 | φ400 | φ400 |
|  | Thickness | 2 mm | 2 mm | 2 mm | 2 mm |
|  | Space factor | 100% | 100% | 100% | 100% |
|  | Flatness | 48 μm | 50 μm | 50 μm | 50 μm |
| Heat transfer section (protruding member) | Material | Cu (bulk body) |  |  | Cu (bulk body) |
|  | Size | φ3 |  |  | φ3 |
|  | Length | 15 mm |  |  | 15 mm |
|  | The number of protruding members (occupancy) | 7,812 (50%) |  |  | 7,812 (50%) |
|  | Space factor | 100% |  |  | 100% |
| Heating section | Power consumption | 200 W | 200 W | 200 W | 200 W |
| Cooling | Airflow rate | 100 L/min | 100 L/min | 100 L/min | 100 L/min |
| Difference in in-plane temperature (in region R) (Greatest temperature value − smallest temperature value) | 200 W | 16.32 | 13.06 | 10.88 | 12.51 |
|  | Evaluation | poor | poor | poor | poor |

According to Examples 1 to 7 and Comparative examples 1 to 5, in the case where at least one of the base member 232 and the protruding member 234 of the heat transfer section 230 was formed of the metal porous structure (specifically, the metal fiber structure or metal powder sintered body), the temperature difference on the surface of the placement section 210 was 10° C. or less when air was sent to the temperature control unit at 100 L/minute from the lower side in the direction indicated by arrows, and uniformity of an in-plane temperature of the placement surface of the placement section 210 was successfully maintained. Meanwhile, in the case where the base member 232 and the protruding members 234 of the heat transfer section 230 were formed of a metal bulk body instead of the metal porous structure, temperature difference on the surface of the placement section 210 was greater than 10° C. when air was sent to the temperature control unit at 100 L/minute from the lower side in the direction indicated by arrows, and it was impossible to maintain uniformity of an in-plane temperature of the placement surface of the placement section 210.

The invention claimed is:

1. A temperature control unit comprising:
 a substantially flat-plate-shaped placement section configured to support a heat transfer target;
 a heating section configured to heat a heat transfer target placed on the placement section; and
 a heat transfer section disposed in contact with at least one of the placement section and the heating section, the heat transfer section being at least partially formed of a metal porous structure, wherein
  the heat transfer section has a substantially flat-plate-shaped base member disposed in contact with at least one of the placement section and the heating section, and a protruding member protruding from the base member, and
  at least the base member or the protruding member is formed of the metal porous structure.

2. The temperature control unit according to claim 1, wherein the metal porous structure includes a metal fiber structure formed of a metal fiber.

3. The temperature control unit according to claim 2, wherein the metal fiber includes at least one of a copper fiber, an aluminium fiber, a nickel fiber, and a stainless steel fiber.

4. The temperature control unit according to claim 3, wherein the metal fiber structure is non-woven fabric.

5. The temperature control unit according to claim 3, wherein
 the heat transfer section has a substantially flat-plate-shaped base member disposed in contact with at least one of the placement section and the heating section, and a protruding member protruding from the base member, and
 at least the base member or the protruding member is formed of the metal porous structure.

6. The temperature control unit according to claim 2, wherein the metal fiber structure is non-woven fabric.

7. The temperature control unit according to claim 6, wherein
 the heat transfer section has a substantially flat-plate-shaped base member disposed in contact with at least one of the placement section and the heating section, and a protruding member protruding from the base member, and
 at least the base member or the protruding member is formed of the metal porous structure.

8. The temperature control unit according to claim 2, further comprising a housing configured to house the heat transfer section between the placement section and the housing, wherein
 the housing is formed to have a space configured to allow fluid to flow therein.

9. The temperature control unit according to claim 1, wherein the base member and the protruding member are formed of the metal porous structure.

10. The temperature control unit according to claim 9, wherein a plurality of the protruding members are disposed in the heat transfer section, and the protruding members are bar-shaped members, plate-shaped members, or a combination thereof extending in a direction orthogonal to the base member.

11. The temperature control unit according to claim 1, wherein a plurality of the protruding members are disposed in the heat transfer section, and the protruding members are bar-shaped members, plate-shaped members, or a combination thereof extending in a direction orthogonal to the base member.

12. The temperature control unit according to claim 1, further comprising a housing configured to house the heat transfer section between the placement section and the housing, wherein
the housing is formed to have a space configured to allow fluid to flow therein.

13. The temperature control unit according to claim 12, wherein
the space formed in the housing is demarcated into a plurality of regions by a partition member, and
each of the regions is configured to allow fluid to flow therein.

14. The temperature control unit according to claim 13, wherein the space formed in the housing is demarcated by the partition member such that the plurality of regions form substantially concentric circles.

15. The temperature control unit according to claim 13, wherein fluid flows in each of the regions such that fluids in adjacent regions among the regions flow in opposite directions.

16. A temperature control unit comprising:
a substantially flat-plate-shaped placement section configured to support a heat transfer target;
a heating section configured to heat a heat transfer target placed on the placement section;
a heat transfer section disposed in contact with at least one of the placement section and the heating section; and
a housing configured to house the heat transfer section between the placement section and the housing, wherein
the housing is formed to have a space configured to allow fluid to flow therein,
the space formed in the housing is demarcated into a plurality of regions by a partition member, and
each of the regions is configured to allow fluid to flow therein.

17. The temperature control unit according to claim 16, wherein the space formed in the housing is demarcated by the partition member such that the plurality of regions form substantially concentric circles.

18. The temperature control unit according to claim 16, wherein fluid flows in each of the regions such that fluids in adjacent regions among the regions flow in opposite directions.

19. A temperature control unit comprising:
a substantially flat-plate-shaped placement section configured to support a heat transfer target;
a heating section configured to heat a heat transfer target placed on the placement section; and
a heat transfer section disposed in contact with at least one of the placement section and the heating section, the heat transfer section being at least partially formed of a metal porous structure that includes a metal fiber structure formed of a metal fiber, wherein
the heat transfer section has a substantially flat-plate-shaped base member disposed in contact with at least one of the placement section and the heating section, and a protruding member protruding from the base member, and
at least the base member or the protruding member is formed of the metal porous structure.

20. The temperature control unit according to claim 19, wherein
the heat transfer section has a substantially flat-plate-shaped base member disposed in contact with at least one of the placement section and the heating section, and a protruding member protruding from the base member, and
at least the base member or the protruding member is formed of the metal porous structure.

* * * * *